(12) United States Patent
Hopfer, III et al.

(10) Patent No.: US 6,537,082 B2
(45) Date of Patent: *Mar. 25, 2003

(54) ELECTRICAL CONNECTOR

(75) Inventors: Albert N. Hopfer, III, Arlington Heights, IL (US); Thaddeus M. Rachwalski, Palos Hills, IL (US); Charles J. Shedore, Elmhurst, IL (US)

(73) Assignee: Cinch Connectors, Inc., Lombard, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/956,859

(22) Filed: Oct. 23, 1997

(65) Prior Publication Data

US 2002/0034892 A1 Mar. 21, 2002

(51) Int. Cl.[7] .............................. H01R 12/00; H05K 1/00
(52) U.S. Cl. .......................... 439/67; 439/567; 439/493
(58) Field of Search ................................ 439/167, 493, 439/567

(56) References Cited

U.S. PATENT DOCUMENTS

| 3,324,445 A | 6/1967 | Miller ........................... 339/61 |
| 3,967,162 A | 6/1976 | Ceresa et al. ........ 317/101 CM |
| 4,118,094 A | 10/1978 | Key ....................... 330/75 MP |

(List continued on next page.)

FOREIGN PATENT DOCUMENTS

| EP | 0385770 A | 9/1990 |
| EP | 0720254 A2 | 7/1996 |

OTHER PUBLICATIONS

Cinch Catalog 1988, Flex Circuit and Flat Cable Connectors, pp. 89–109, Labinal Components and Systems, Inc.

*Primary Examiner*—Javaid Nasri
(74) *Attorney, Agent, or Firm*—Leydig, Voit & Mayer, Ltd.

(57) ABSTRACT

The electrical connector can be used to establish mechanical and electrical connection between a flexible component, such as, a flexible circuit or a flexible cable, and a printed circuit board. The connector generally comprises an upper housing, a contact housing, contacts, expandable leg members and post elements. The expandable legs are disposed on the upper housing. The contacts are disposed in openings in the contact housing. In order to use the connector, the flexible component is placed between the contact housing and the upper housing. Alignment posts ensure that the contacts and the conductors on the flexible component are precisely aligned. The connector is mounted to the circuit board by inserting the expandable legs in mounting holes in the circuit board. Once inserted, the expandable legs can be radially expanded by driving the post elements into the expandable legs. The circuit board also include alignment holes which ensure the proper orientation of the contacts to circuit board. The connector may also include an assembly tool which is adapted to both preload the contacts and drive the post elements into the expandable legs. Additionally, the electrical connector may include a removal tool which can be used to drive the inserted post elements out of the expandable legs.

50 Claims, 7 Drawing Sheets

U.S. PATENT DOCUMENTS

| | | | |
|---|---|---|---|
| 4,235,500 A | 11/1980 | Belopavlovich et al. | 339/176 MF |
| 4,519,659 A * | 5/1985 | Shino et al. | 439/591 |
| 4,574,331 A | 3/1986 | Smolley | 371/393 |
| 4,581,679 A | 4/1986 | Smolley | 361/395 |
| 4,684,194 A | 8/1987 | Jenkins et al. | 439/260 |
| 4,733,172 A | 3/1988 | Smolley | 324/158 P |
| 4,808,112 A | 2/1989 | Wood et al. | 439/66 |
| 4,850,883 A * | 7/1989 | Kabadi | 439/67 |
| 4,988,306 A | 1/1991 | Hopfer, III et al. | 439/66 |
| 4,992,053 A | 2/1991 | Lindeman et al. | 439/66 |
| 5,007,841 A | 4/1991 | Smolley | 439/66 |
| 5,007,843 A | 4/1991 | Smolley | 439/66 |
| 5,013,249 A | 5/1991 | Lindeman et al. | 439/66 |
| 5,019,945 A | 5/1991 | Smolley | 361/412 |
| 5,051,366 A * | 9/1991 | Anderson | 439/67 |
| 5,127,837 A | 7/1992 | Shah et al. | 439/71 |
| 5,181,854 A | 1/1993 | Masuda | 439/67 |
| 5,219,293 A * | 6/1993 | Imamura | 439/67 |
| 5,248,262 A * | 9/1993 | Busacco | 439/67 |
| 5,282,111 A | 1/1994 | Hopfer | 361/704 |
| 5,485,351 A | 1/1996 | Hopfer et al. | 361/704 |
| 5,947,764 A * | 9/1999 | Pan | 439/67 |

* cited by examiner

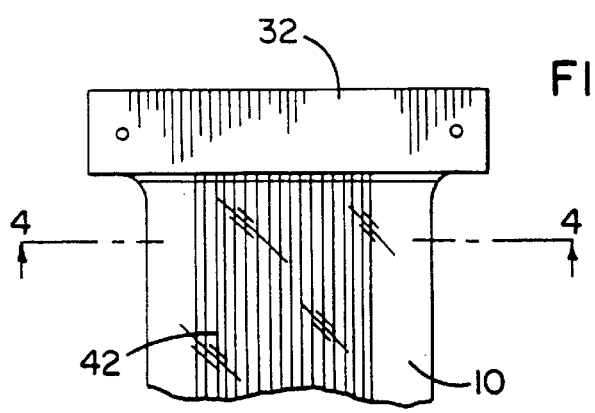
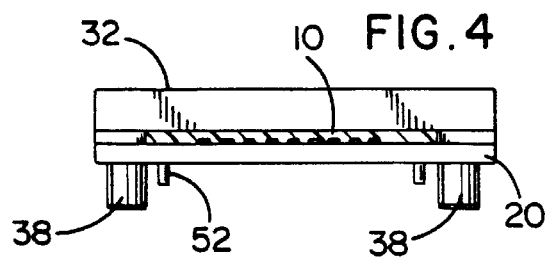
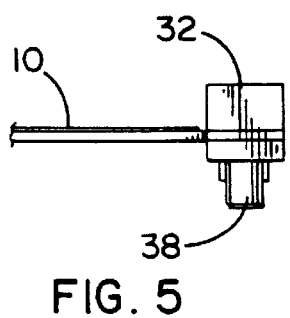
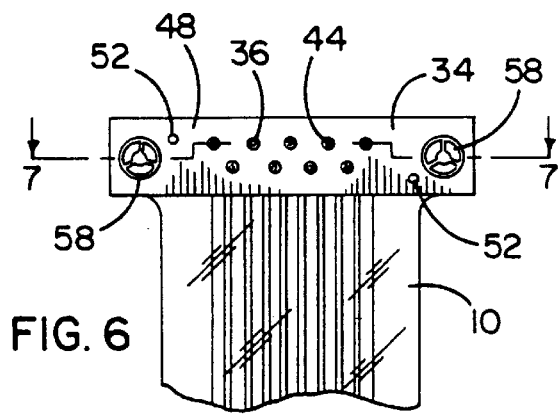
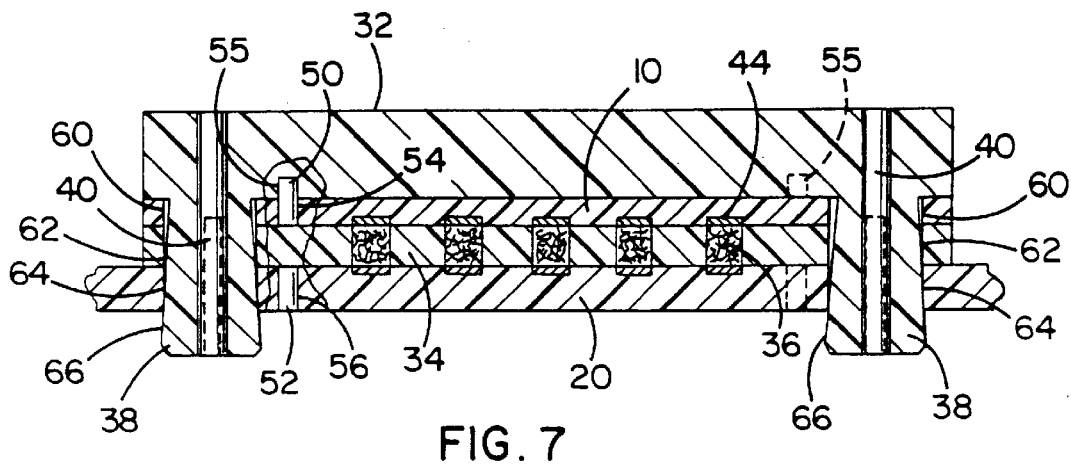

ELECTRICAL CONNECTOR

FIELD OF THE INVENTION

This invention relates to an electrical connector and, more particularly, to an electrical connector for use with flexible components, such as, flexible circuits or flexible cables.

BACKGROUND OF THE INVENTION

One use of electrical connectors is to connect flexible components, such as, flexible circuits or flexible cables to various electrical devices such as printed circuit boards. The flexible components typically include a number of conductors which must be connected electrically with the appropriate contacts on the printed circuit board. The types of connectors that are generally used to establish electrical connection between the flexible component and the printed circuit board have several disadvantages.

One disadvantage is that these types of connectors generally do not securely lock the flexible component in the connector. Therefore, the flexible component is susceptible to being pulled out of the connector. Another disadvantage is that these connectors require soldering that can be troublesome to perform and time consuming. Yet another disadvantage is that during assembly the flexible component can be inserted into the connector at an angle. If the flexible component is secured in the connector at an angle, it is likely that electrical shorts will develop.

OBJECTS OF THE INVENTION

A general object of the present invention is to provide an electrical connector which can be used to electrically connect a flexible component to a substrate such as a printed circuit board.

An additional object of the present invention is to provide an electrical connector that improves the retention of the flexible component in the connector. Another object of the invention is provide an electrical connector which does not require soldering and thus avoids soldering problems.

A further object of the present invention is to provide alignment features for each of the components so that the components can be assembled in only one specific orientation. Another object of the invention is to provide alignment features for each of the components so that the traces on the flexible component are precisely aligned with the contacts on the circuit board during installation.

An additional object of the invention is to provide an assembly tool which preloads the contacts in the connector before the connector is secured to the circuit board. Another object of the present invention is to provide a removal tool that can be used to disconnect the printed circuit board and the flexible component from the electrical connector.

Another object is to provide an electrical connector which has the mounting hardware attached to the electrical connector versus separate components (i.e., nuts and bolts) which could be lost.

A further object is to provide a low cost method for packaging the electrical connector.

Other objects and advantages of the invention will become apparent upon reading the following description and upon reference to the drawings.

SUMMARY OF THE INVENTION

The electrical connector of the present invention can be used to establish both mechanical and electrical connection between a flexible component and a printed circuit board. The electrical connector may include an upper housing, a contact housing, contacts, expandable leg members and post elements.

The contacts are disposed in holes that are provided in the contact housing and the contacts are positioned such that they correspond to the desired locations of circuit interconnection between the flexible component and the circuit board.

In order to use the connector, the flexible component is first assembled between the upper housing and the contact housing. The contact housing and the flexible component include alignment posts which ensure that the conductors on the flexible component are precisely aligned with the contacts in the contact housing.

Next, the assembly of the upper housing, the contact housing, and the flexible component can be attached to the circuit board via the expandable legs and the post elements. The expandable legs are disposed on the upper housing and are adapted to be inserted into mounting holes that are provided in the circuit board, the contact housing, and the flexible component. Once the expandable legs are inserted, they can be radially expanded into engagement with the mounting holes in the circuit board by driving the post elements into the expandable legs. The circuit board also includes alignment holes that ensure that the conductors on the circuit board are in precise alignment with the contacts in the contact housing.

An assembly tool can be used to drive the post elements into the expandable legs. In addition, the assembly tool ensures that the contacts in the contact housing are preloaded before the connector is secured to the circuit board. Additionally, the connector may include a removal tool that is designed to drive the inserted post element out of the expandable legs.

BRIEF DESCRIPTION OF THE DRAWINGS

FIG. 3 is a top view of the electrical connector;

FIG. 4 is a front view of the electrical connector taken along line 4—4 of FIG. 3;

FIG. 5 is a side view of the electrical connector;

FIG. 6 is a bottom plan view of the electrical connector;

FIG. 7 is a cross sectional view of the electrical connector taken along line 7—7 of FIG. 6;

DESCRIPTION OF THE EMBODIMENT

Figure 1:
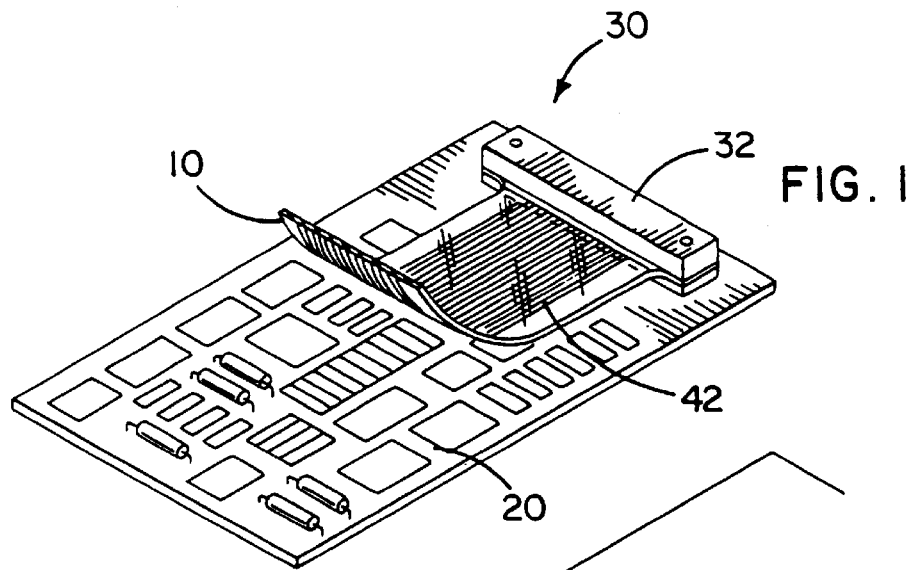
FIG. 1 is a left front perspective view of an electrical connector constructed in accordance with the teachings of this invention which is attached to a printed circuit board.
Figure 2:
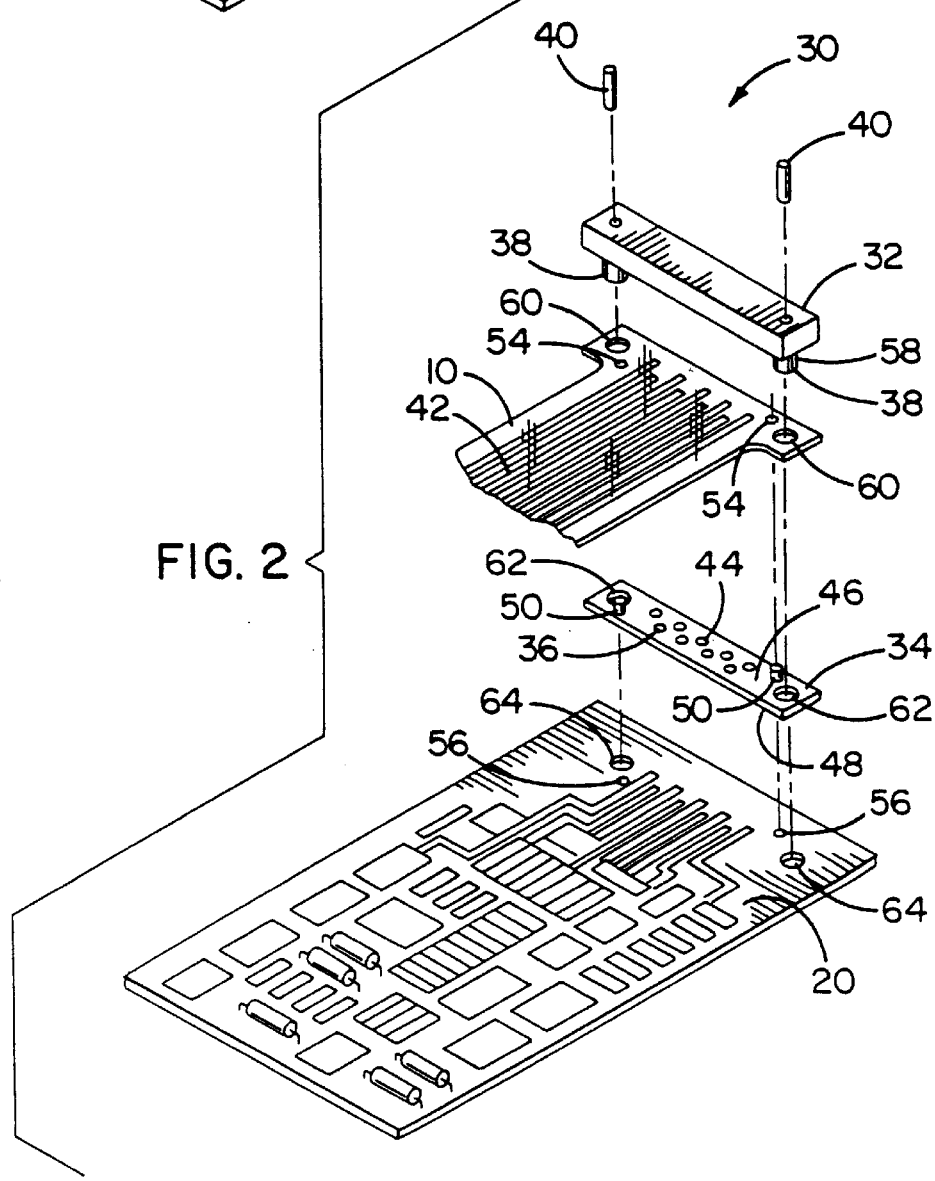
FIG. 2 is an exploded view of the electrical connector and the printed circuit board.

An electrical connector 30 constructed in accordance with the teachings of the present invention is illustrated in FIG. 1. As shown in FIG. 1, the connector 30 can be used to establish mechanical and electrical connection between a flexible component 10 and a printed circuit board 20. As shown in FIG. 2, the electrical connector 30 may include an upper housing 32, a contact housing 34, contacts 36, expandable leg members 38, and post elements 40.

The flexible component 10 includes at least one conductor. The flexible component 10 may be a flexible cable or a flexible circuit. In the illustrated embodiment, the flexible component 10 comprises a flexible substrate material on which a plurality of conductors 42 in the form of electrically conductive traces are affixed, as best shown in FIGS. 1–3. The conductive traces 42 may extend the length of the flexible component 10 and may be arranged substantially parallel to each other. In the illustrated embodiment, the ends of the conductive traces 42 are staggered as shown in FIG. 2. A layer of insulating material is typically placed over the traces 42 such that the traces are covered except adjacent the two ends of the flexible component 10. In one embodiment, the substrate material comprises a thin piece of mylar and the conductive traces are made of tin plated copper.

Referring to FIGS. 2, 6, and 7, the contact housing 34 includes at least one hole 44 therethrough. The contact housing 34 typically contains a plurality of spaced holes 44 arranged in an array, such as rows, chosen to correspond to the locations of circuit interconnection. Accordingly, the spaced holes 44 correspond to the electrical contact pattern on the printed circuit board 20 and on the flexible component 10.

Figure 9:
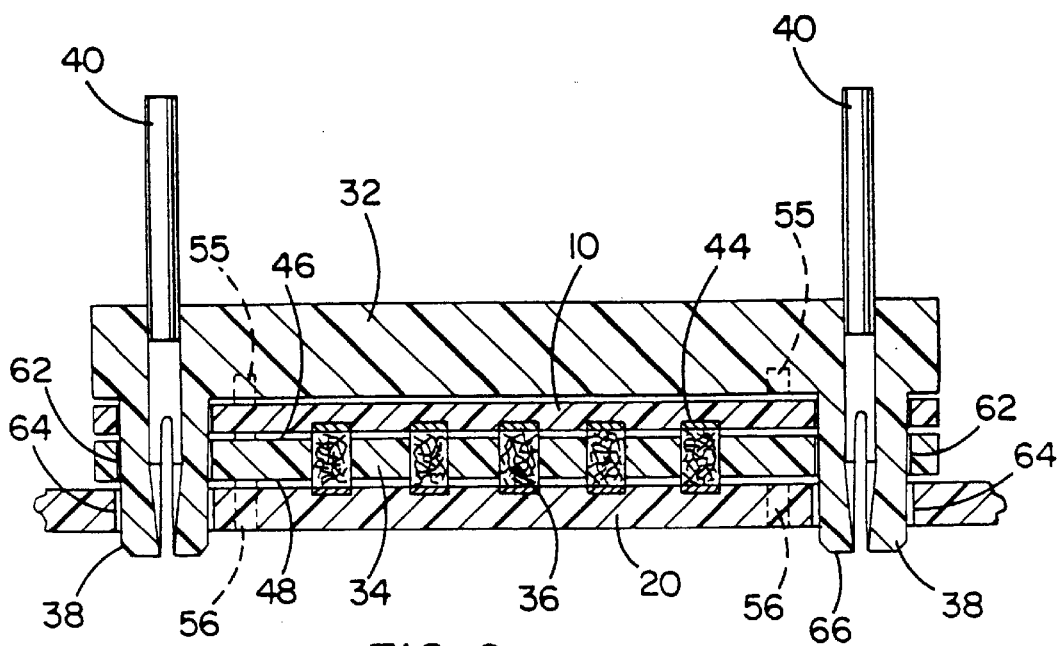
FIG. 9 is a cross sectional view similar to FIG. 7 with the contacts in an uncompressed state and the posts partially inserted into the expandable members.
Figure 16:
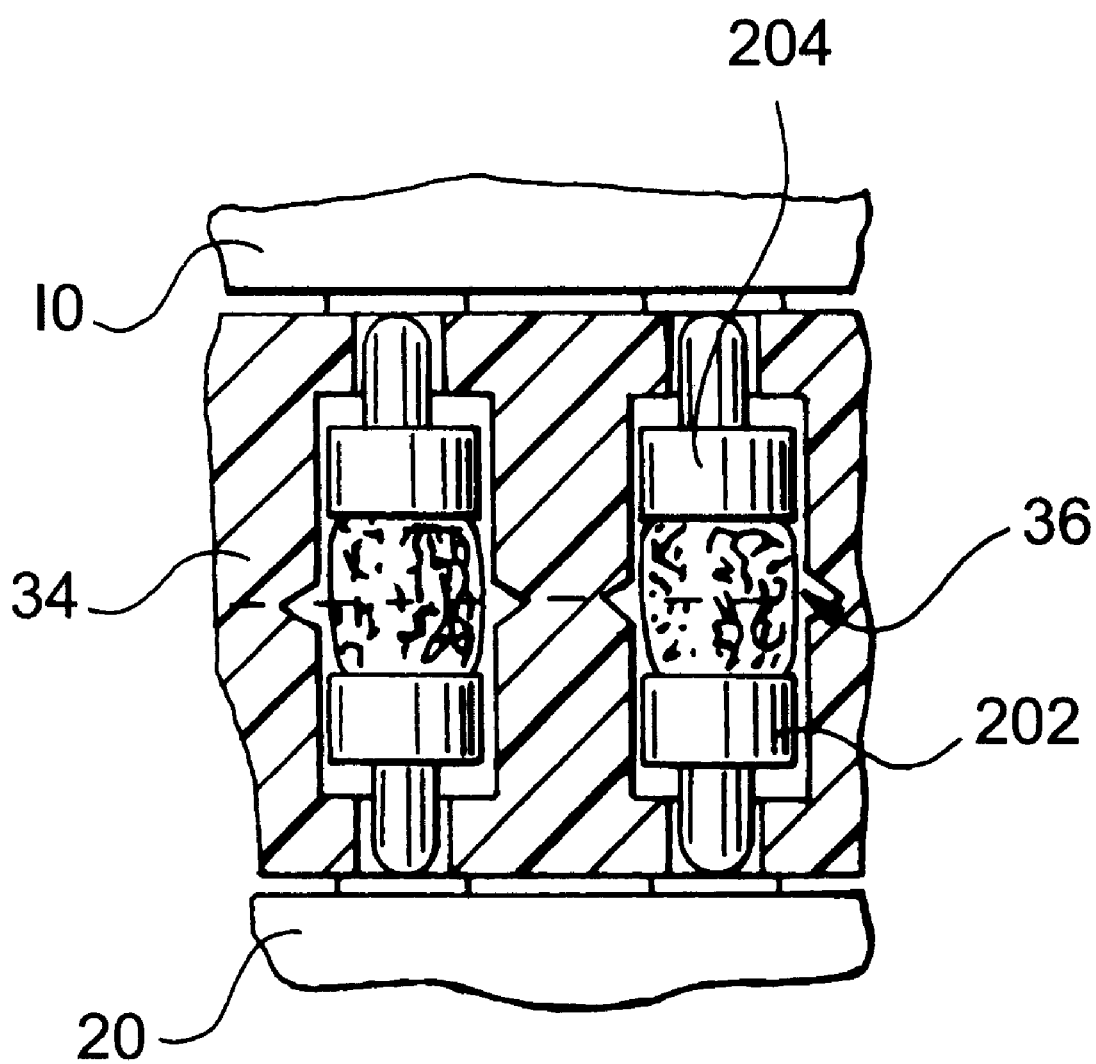
FIG. 16 is a cross-sectional view of an electrical connector according to the present invention showing an alternative contact configuration.

The hole 44 at each location where an electrical connection is desired contains a resilient electrical contact 36, as best shown in FIGS. 2, 6, and 7. These electrical contacts electrically couple the conductive traces 42 on the flexible component 10 to a plurality of electrically conductive traces or pads which are formed on the printed circuit board 20. In one embodiment, each of the electrical contacts 36 comprises a resiliently wadded conductor typically in the form of an elongated substantially cylindrical contact element comprising a resiliently and randomly wadded single thin gauge electrically conductive wire. By way of example, the contacts 36 may be of the type commercially marketed by Labinal Components and Systems, Inc. of Elk Grove Village, Ill., U.S.A. under the designation "CIN::APSE." The contacts 36 extend generally from at least the first surface 46 of the contact housing 34 to a second surface 48 of the contact housing, and protrude slightly beyond the first and second surfaces as shown in FIG. 9. The respective ends of each of the electrical contacts 36 are exposed at the first and second surfaces 46, 48, respectively. The electrical contacts 36 can include additional elements such as plungers 202, 204 (see, e.g. FIG. 16), as shown in U.S. Pat. No. 5,127,837 which is incorporated herein by reference. In another embodiment, the electrical contacts comprise electrically conductive elastomeric contacts.

In order to ensure that the conductive traces on the printed circuit board 20 are aligned with the conductors on the flexible component 10, the contact housing 34 includes alignment posts. Referring to FIGS. 2, 6, and 7, the illustrated embodiment of the contact housing 34 has a pair of alignment posts 50 on its first surface 46 and a pair of alignment posts 52 on its second surface 48. The alignment posts 50 on the first surface are positioned so that the posts 50 engage complemental alignment holes 54 in the flexible component when the flexible component is assembled into the connector, as shown in FIGS. 2 and 7. The engagement of the alignment posts 50 with the alignment holes 54 also reduces the possibility of the flexible component 10 being assembled in the connector at an angle relative to the contact housing 34 and the circuit board 20. In addition, the alignment posts reduce the possibility of the flexible component being accidentally removed from the connector. As shown in FIG. 7, the upper housing 32 also includes alignment holes 55 that receive the alignment posts 50. Similarly, the alignment posts 52 on the second side of the contact housing are positioned so that they engage complemental alignment holes 56 in the printed circuit board when the connector is secured to the printed circuit board. The alignment posts 50, 52 and the corresponding alignment holes 54, 56 are positioned such that the flexible component 10, the contact housing 34 and the circuit board 20 can only be assembled in one specific orientation.

Referring to FIGS. 2 and 6–9, the electrical connector has a press-type mounting arrangement for mounting the upper housing 32, the flexible component 10, and the contact housing 34 to the circuit board 20. As shown in FIGS. 2 and 6, the upper housing 32 includes one or more expandable leg members 38 that are adapted to receive and retentively grip corresponding press-type post elements 40. Each of the expandable legs 38 comprises a plurality of spaced apart fingers 58. The fingers 58 are radially expandable along at least a portion thereof and are arranged in a generally symmetrical configuration which defines a cavity that is sized to receive the post element 40.

Prior to the expansion of the fingers 58, the outer surface of each of the expandable legs 38 provides an outer cross-sectional dimension that is equal to or slightly less than the mounting holes 60, 62, 64 in the flexible component, the contact housing, and the circuit board. Thus, the expandable legs 38 may be placed or lightly press-fit within the mounting holes 60, 62, 64 in the flexible component, contact housing, and printed circuit board prior to expansion of the legs 38 via the post elements 40. As noted above, the alignment pins 50, 52 and the corresponding alignment holes 54, 56 ensure that when the components are placed or press-fit together they are in the proper orientation.

As shown in FIGS. 7 and 9, each of the expandable legs 38 preferably includes a distal portion 66 which expands outwardly or otherwise deforms when the post element 40 is fully inserted in the expandable leg. When the expandable leg 38 is fully inserted into the mounting hole 64 in the circuit board, the distal portion 66 protrudes through the mounting hole 64 on the side of the circuit board 20 opposite the upper housing 32. As shown in FIG. 5, when the post element 40 is fully axially inserted within the complemental expandable leg 38, each of the sleeve fingers 58 is urged radially outwardly such that it engages the inner surface of the of the mounting holes 64, 62 in the circuit board and the contact housing. Similarly, the distal portion 66 of the expandable legs expand radially outwardly such that they achieve a transverse dimension that is larger than the mounting hole 64 in the circuit board thereby securing the electrical connector to the circuit board 20. The engagement of the expandable legs 38 with the mounting holes 60 in the flexible component also ensures that the flexible component 10 cannot be pulled out of the connector.

Figure 14:
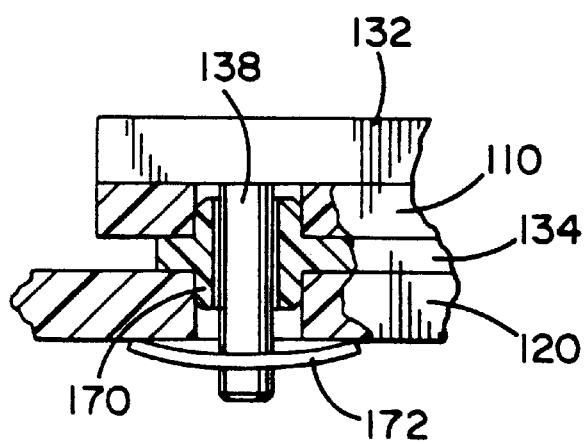
FIG. 14 is a partial fragmentary cross sectional view of another embodiment of the attachment structure for the electrical connector.

Other attachment structures could be used for attaching the connector of the present invention to a substrate such as a printed circuit board. For example, referring to FIG. 14, the upper housing 132 may be provided with at least one leg 138. In the embodiment of FIG. 14, the leg 138 is inserted into the corresponding mounting holes in the contact housing 134, the flexible component 110 and the circuit board 120. Once the leg 138 is fully inserted, a retaining clip 172 may be placed over the distal end of the leg thereby securing the upper housing, the contact housing, and the flexible component to the circuit board. In this embodiment, the contact housing 134 includes a boss portion 170. However, the boss portion 170 could be eliminated if the leg 138 were sized such that it was slightly smaller than the corresponding mounting holes.

Figure 15:
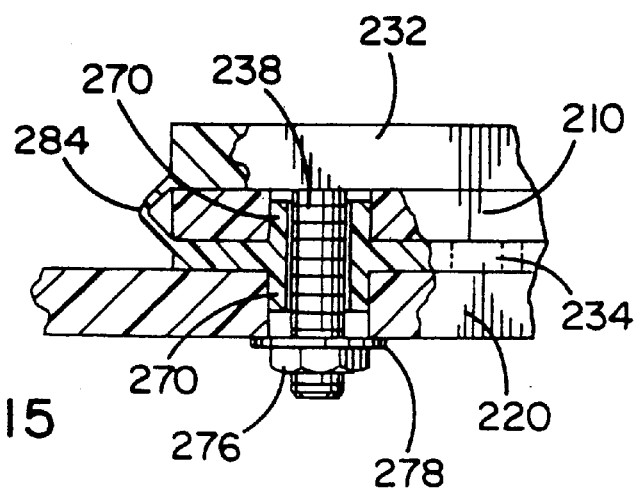
FIG. 15 is a partial fragmentary cross sectional view of another embodiment of the attachment structure for the electrical connector.

In another embodiment shown in FIG. 15, the upper housing 232 may be provided with at least one leg 238 that is threaded to receive a nut 276. Once the leg 238 has been fully inserted in the corresponding holes in the flexible component 210, the contact housing 234 and the circuit board 220, the connector is secured to the circuit board with the nut 276 and a washer 278. In this embodiment, the contact housing 234 includes a boss portion 270. However, the boss portion 270 could be eliminated if the leg 238 were sized such that it was slightly smaller than the corresponding mounting holes. In another embodiment, the leg could be a bolt which extends through a hole in the upper housing 232 and through the other mounting holes.

Referring to FIG. 15, the upper housing 232 and the contact housing 234 are integral and joined by a living hinge 284. The living hinge 284 allows the upper housing 232 and the contact housing 234 to be spaced apart which permits the insertion and assembly of the flexible component 210 to the connector. In addition, by joining the upper housing and the contact housing with the hinge, the number of individual parts is reduced which alleviates problems associated with individual parts during manufacture and assembly.

Figure 8:
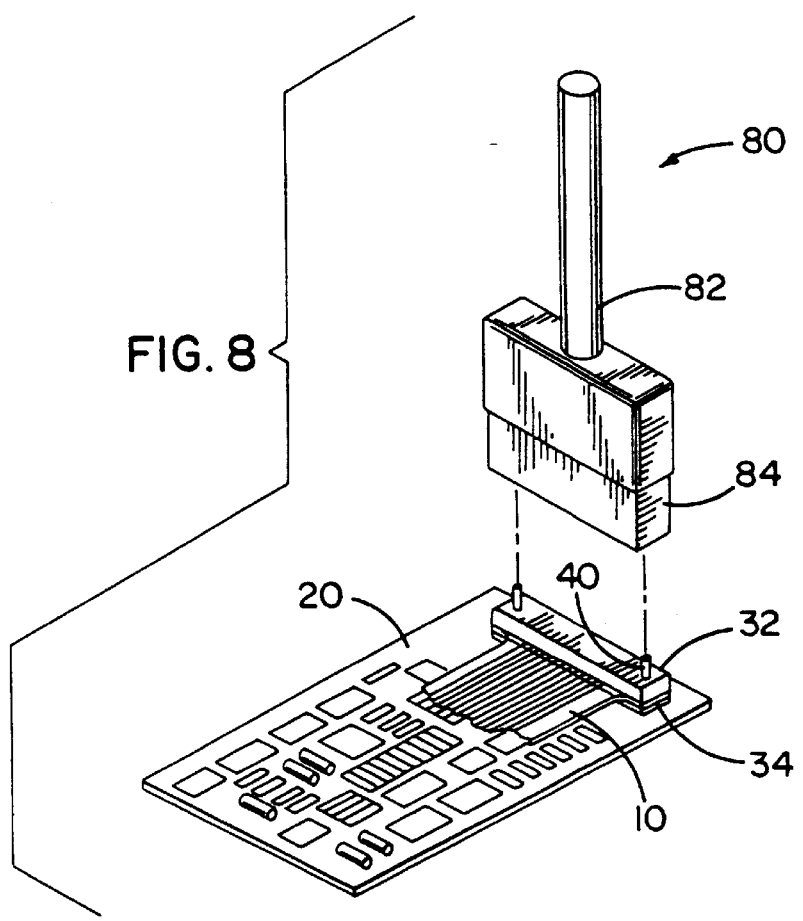
FIG. 8 is a perspective view of the electrical connector on a printed circuit board and the assembly tool constructed in accordance with the teachings of the invention.
Figure 10:
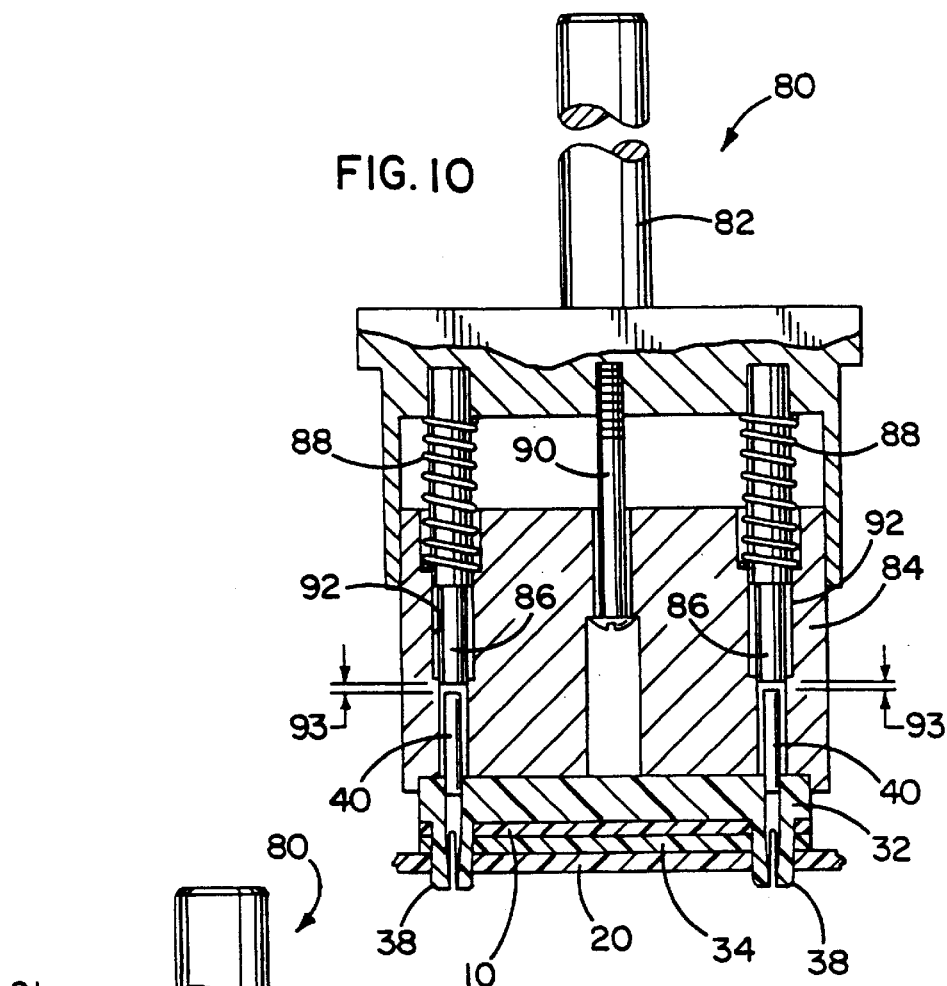
FIG. 10 is a fragmentary cross sectional view of the assembly tool mounted to the electrical connector prior to driving the posts into the expandable members.
Figure 11:
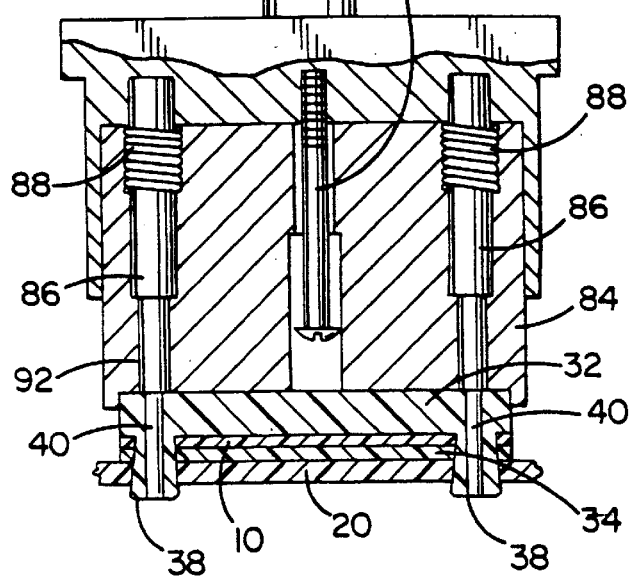
FIG. 11 is a fragmentary cross sectional view of the assembly tool and the electrical connector showing the pins driven into the expandable members.

FIGS. 8, 10, and 11 illustrate an assembly tool 80 that can be used to drive the post elements 40 into the expandable legs 38. The assembly tool 80 generally comprises a handle 82, a movable housing 84, a pair of driving pins 86, a pair of spring elements 88, and a bolt 90. As shown in FIGS. 10 and 11, the driving pins 86 are disposed in apertures 92 in the movable housing 84 and are connected to the handle 82. The spring elements 88 are positioned around the driving pins 86 between the handle 82 and the movable housing 84. The movable housing is attached to the handle with the bolt 90. The movable housing can move slidably along the bolt between a contact preload position (FIG. 10) and a post driving position (FIG. 11).

The assembly tool 80 may be used in the following manner. Prior to using the assembly tool 80, the post elements 40 are partially inserted into the expandable legs 38 as shown in FIG. 9. As illustrated in FIG. 9, the contacts 36 in the contact housing 34 are in an uncompressed state wherein a portion of the contacts protrudes slightly beyond the first and second surfaces 46, 48 of the contact housing.

The object of the assembly tool is to compress the contacts 36 (i.e. preload the contacts) before the post elements are fully inserted into the expandable legs. Referring to FIGS. 8 and 10, the user would position the assembly tool into engagement with the upper housing 32 such that the top ends of the post elements 40 are inserted into the driving pin apertures 92 on the assembly tool. As shown in FIG. 10, when the assembly tool is first brought into engagement with the upper housing 32, the movable housing 84 engages the top side of the upper housing 32 however, the driving pins 86 do not engage the post elements 40.

Once the assembly tool engages the upper housing, the user will apply downward pressure (in the direction of arrow 91 in FIG. 11) on the assembly tool. The downward pressure will cause the housing 84 to compress the contacts 36 (i.e. preload the contacts). Thus, the contacts are flush with or substantially flush with the first and second surfaces 46, 48 of the contact housing. As the user continues to apply downward pressure, the downward pressure will cause the movable housing 84 to slide upward on the bolt 90, thereby compressing the springs 88. As the movable housing 84 slides upward, the driving pins 86 travel the distance of the gap 93 and will engage the post elements 40. As the movable housing continues to slide upward on the bolt, the movable housing is also moving upwards relative to the driving pins 86 such that when the movable housing reaches the underside of the handle 82, as shown in FIG. 11, the driving pins will have driven the post elements 40 into the expandable legs 38. The arrangement of the movable housing and the springs enables the assembly tool to preload the contacts through the pressure which the movable housing exerts on the upper housing. Thus, the contacts 36 are preloaded before the post elements are fully inserted into the expandable legs and the upper housing is secured to the circuit board.

Figure 12:
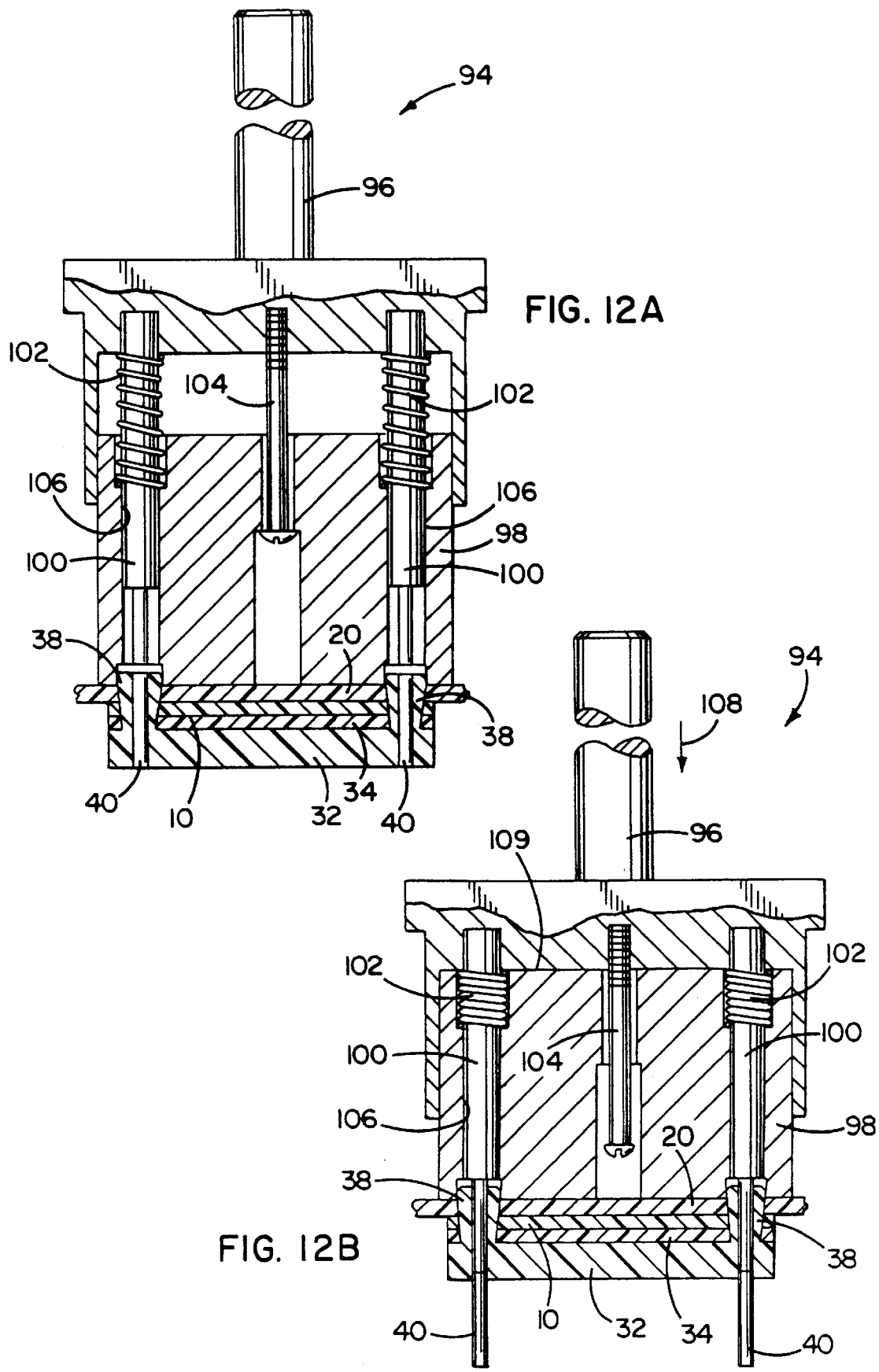
FIG. 12A is a fragmentary cross sectional view of a removal tool and the electrical connector.
FIG. 12B is a fragmentary cross sectional view of a removal tool and the electrical connector showing the posts being partially displaced from the expandable member.

Referring to FIGS. 12A and 12B, the present invention may also include a removal tool 94. The removal tool 94 has a configuration that is similar to the assembly tool 80. As shown in FIG. 12A, the removal tool 94 generally comprises a handle 96, a movable housing 98, a pair of driving pins 100, a pair of spring elements 102, and a bolt 104. The movable housing 98 of the removal tool is connected to the handle 96 by the bolt 104 such that the movable housing 98 can move relative to the handle 96. The driving pins 100 are disposed in apertures 106 in the movable housing 98 and are connected to the handle 96. The spring elements 102 are positioned around the driving pins 100 between the handle 96 and the movable housing 98. The housing 98 can move relative to the handle 96 when the springs are compressed.

The removal tool 94 can be used to push the post elements 40 partially or fully from the expandable legs 38. The removal tool 94 may be used in the following manner. As shown in FIG. 12A, the user would position the movable housing 98 into engagement with the side of the circuit board 20 which is opposite the side where the upper housing 32 and contact housing 34 are mounted. Specifically, the removal tool is positioned into engagement with the circuit board 20 so that the apertures 106 on the removal tool engage the ends of the expandable legs 38. The user will then push on the removal tool in direction indicated by the arrow 108 in FIG. 12B. As the pressure is applied to the removal tool, the movable housing 98 will slide upward on the bolt 104 and the springs 102 and compress the springs. As the springs are compressed, the driving pins 100 will exert force on the post elements 40 and thereby push the post elements partially or fully from the expandable legs. When the movable housing 84 reaches the underside 109 of the handle 82, the driving pins 100 will protrude into the expandable legs 38 so that they can displace the posts 40 from the expandable legs. In one embodiment, the driving pins are long and will push the posts fully from the legs so that the posts are separated from the upper housing. In another embodiment, the driving pins are short and will push the posts partially from the legs, such as, the position of the posts shown in FIG. 9. After the posts have been pushed partially or fully from the legs, the removal tool 94 can be removed by not applying pressure to the removal tool and allowing the springs to expand. If the springs are not strong enough, the removal tool can be removed from the connector by merely pulling the removal tool upward in order to remove the driving pins from the expandable legs.

Figure 13:
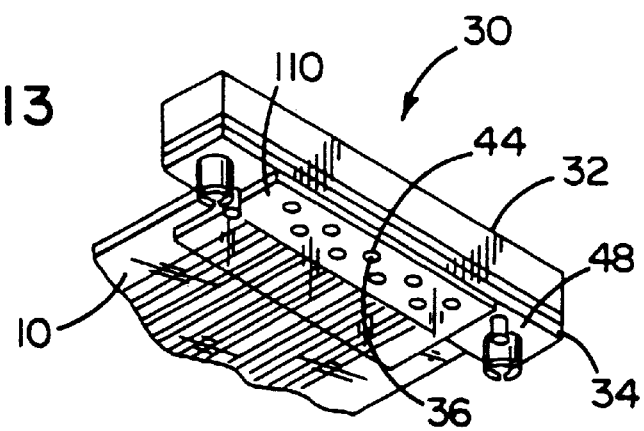
FIG. 13 is a bottom perspective view of the electrical connector with a protective film to protect the contacts during shipment.

FIG. 13, shows one embodiment of packaging for the connector 30 of the present invention. When the electrical connector is shipped to certain users, the flexible component 10, the upper housing 32, and the contact housing 34 may be assembled together, however, the components are not attached to a circuit board. These users will then attach the components to the circuit board. Thus, during shipment, the contacts 36 on the second surface 48 of the contact housing are exposed. Since the contacts protrude slightly beyond the holes 44 in the contact housing, they are susceptible to damage. In order to protect the contacts, the connector must be packaged such that the contacts are shielded from the environment. One embodiment to package the contacts is shown in FIG. 13. A protective film 110 covers a portion of the second surface 48 of the contact housing 34 and covers the contacts 36. In one embodiment, the protective film 110 includes an adhesive which allows the film to adhere to the second surface 48. The adhesive may be applied to the entire surface of the film or the adhesive may be omitted from the areas on the film which will cover the contacts 36. The protective film 110 prevents any damage to the contacts during shipment.

As can be appreciated, the connector 30 of the present invention can be used to establish mechanical and electrical connection between a flexible component and a printed circuit board quickly and easily. In order to use the connector, the flexible component 10 is positioned between the upper housing 32 and the contact housing 34 such that the expandable legs 38 engage the corresponding mounting holes 60 and the alignment posts 50, 52 engage the appropriate alignment holes as shown in FIGS. 2 and 7. Specifically, the flexible component 10 is positioned onto the contact housing 34 so that the alignment posts 50 engage the alignment holes 54. This subassembly of the circuit 10 and the contact housing 34 is positioned onto the upper housing 32 so that the legs 38 engage the mounting holes 60, 62 and the alignment posts 50 engage the appropriate alignment holes 55.

In another method, the flexible component is assembled to the upper housing 32 so that the legs 38 engage the mounting holes 60 and the alignment holes 54, 55 are aligned. The subassembly of the flexible component 10 and the upper housing 32 is then positioned onto the contact housing 34 so that the legs 38 engage the mounting holes 62 and the alignment posts 50 engage the alignment holes 54, 55.

The assembly of the contact housing, the upper housing, and the flexible component can be attached to the printed circuit board 20 by inserting the expandable legs 38 into the mounting holes 64 on the circuit board and the alignment posts 52 into the alignment holes 56 on the circuit board. After the expandable legs have been placed within the mounting holes, the post members 40 may be pushed into the expandable legs in order to expand the legs to engage the circuit board. The post members can be pushed by the assembly tool 80 and, when, desired the connector can be removed from the circuit board by using the removal tool 94.

The following applications are incorporated herein by reference: application Ser. No. 08/467,727, filed Jun. 6, 1995 which is a continuation of application Ser. No. 07/923,849, filed Jul. 31, 1992, now U.S. Pat. No. 5,485,351, which is a continuation-in-part of application Ser. No. 07/871,586, filed Apr. 20, 1992, now U.S. Pat. No. 5,282,111, which is a continuation of application Ser. No. 07/499,025, filed Mar. 26, 1990, which is a continuation in-part of application Ser. No. 07/364,343, filed Jun. 9, 1989 which was continued in application Ser. No. 07/754,261, filed Aug. 28, 1991, now U.S. Pat. No. 5,127,837.

While this invention has been described with an emphasis upon embodiments noted above, other embodiments may be used. Accordingly, this invention includes all modifications encompassed within the spirit and the scope of the invention as defined by the following claims.

What is claimed is:

1. An electrical connector for connecting a flexible component to a substrate, the flexible component provided with a plurality of electrical contacts located on a lower surface thereof and the substrate provided with a plurality of electrical contacts located on a upper surface thereof, said connector comprising:

an upper housing having an upper surface and a lower surface;

a contact housing having an upper surface and a lower surface, the contact housing has apertures disposed from the upper surface through to the lower surface, each aperture corresponds to only one contact on the flexible component;

a resilient contact in each aperture for enabling electrical communication between only one electrical contact on the substrate and only one electrical contact on the flexible component, each resilient contact is a wadded wire contact;

an attachment portion extending beyond the lower surface of the upper housing, the attachment portion to attach the lower surface of the upper housing to the upper surface of the contact housing and to attach the lower surface of the contact housing to the substrate to establish electrical connection between said contacts on the lower surface of said flexible component and said contacts on the upper surface of said substrate through said resilient contacts located in said contact housing.

2. The electrical connector as in claim 1 wherein said attachment portion comprises at least one expandable member and a post element for axial insertion in said expandable member.

3. The electrical connector as in claim 2 wherein said post element having an outer surface and being retentively engaged in said expandable member, said expandable member having an inner surface, said outer surface of said post element and said inner surface of said expandable member being of complimentary configurations to effect expansion of said expandable member upon forcible axial movement of said post element in said expandable member.

4. The electrical connector as in claim 2 wherein said expandable member has a first outer configuration and said post element outwardly displacing said expandable member to a second outer configuration when said post element is axially inserted into said expandable member.

5. The electrical connector as in claim 1 wherein said attachment portion comprises at least one leg member and a retaining clip for placement onto a distal end of said leg member.

6. The electrical connector as in claim 1 wherein said attachment portion comprises at least one leg member wherein said leg member is provided with threads for receiving a nut.

7. The electrical connector as in claim 1 wherein said apertures contain a second contact.

8. The electrical connector as in claim 7 wherein said second contact is a plunger.

9. The electrical connector as in claim 8 wherein said apertures contain a third contact.

10. The electrical connector as in claim 9 wherein said third contact is a plunger.

11. The electrical connector as in claim 1 wherein said flexible component is a flexible cable.

12. The electrical connector as in claim 1 wherein said flexible component is a flexible circuit.

13. The electrical connector as in claim 1 wherein said contact housing includes an alignment portion to align said resilient contacts with the contacts on the flexible component and with the contacts on the substrate.

14. The electrical connector as in claim 1 wherein said resilient contacts in the contact housing are covered with a protective film in order to protect said resilient contacts.

15. An electrical connector for connecting a flexible component to a substrate, the flexible component provided with a plurality of electrical contacts located on a lower surface thereof and the substrate provided with a plurality of electrical contacts located on a upper surface thereof, said connector comprising:

an upper housing having an upper surface and a lower surface;

a contact housing having an upper surface and a lower surface, the contact housing has apertures disposed from the upper surface through to the lower surface, each aperture corresponds to only one contact on the flexible component;

a resilient contact in each aperture, each resilient contact is a wadded wire contact capable of providing electrical communication between multiple electrical contacts;

an attachment portion to attach the lower surface of the upper housing to the upper surface of the contact housing and to attach the lower surface of the contact housing to the upper surface of the substrate to establish electrical connection between said contacts on the lower surface of said flexible component and said contacts on the upper surface of said substrate through said resilient contacts located in said contact housing, said attachment portion comprises at least one expandable member including a cavity and a post element for axial insertion into said cavity of said expandable member.

16. The electrical connector as in claim 15 wherein said flexible component is a flexible cable.

17. The electrical connector as in claim 15 wherein said flexible component is a flexible circuit.

18. The electrical connector as in claim 15 wherein said contact housing includes an alignment portion to align said resilient contacts with the contacts on the flexible component and with the contacts on the substrate.

19. The electrical connector as in claim 15 wherein said apertures contain a second contact.

20. The electrical connector as in claim 19 wherein said second contact is a plunger.

21. The electrical connector as in claim 20 wherein said apertures contain a third contact.

22. The electrical connector as in claim 21 wherein said third contact is a plunger.

23. The electrical connector as in claim 15 wherein said resilient contacts in the contact housing are covered with a protective film in order to protect said resilient contacts.

24. The electrical connector as in claim 15 wherein said post element having an outer surface and being retentively engaged in said expandable member, said expandable member having an inner surface, said outer surface of said post element and said inner surface of said expandable member being of complimentary configurations to effect expansion of said expandable member upon forcible axial movement of said post element in said expandable member.

25. The electrical connector as in claim 15 wherein said expandable member has a first outer configuration and said post element outwardly displacing said expandable member to a second outer configuration when said post element is axially inserted into said expandable member.

26. An electrical connector for connecting a flexible component provided with a plurality of electrical contacts located on a lower surface thereof to a substrate, the substrate provided with a plurality of electrical contacts located on a upper surface thereof, said connector comprising:

an upper housing having an upper surface and a lower surface;

a contact housing having an upper surface and a lower surface, the contact housing has apertures disposed from the upper surface through to the lower surface, each aperture corresponds to only one contact on the flexible component;

a resilient contact in each aperture for enabling electrical communication between only one electrical contact on the substrate and only one electrical contact on the flexible component, each resilient contact is a wadded wire contact;

an attachment portion to attach the lower surface of the upper housing to the upper surface of the contact housing and to attach the lower surface of the contact housing to the upper surface of the substrate to establish electrical connection between said contacts on the upper surface of said flexible component and said contacts on the lower surface of said substrate through said resilient contacts, said attachment portion comprises at least one leg member and a retaining clip for placement onto a distal end of said leg member.

27. The electrical connector as in claim 26 wherein said flexible component is a flexible cable.

28. The electrical connector as in claim 26 wherein said flexible component is a flexible circuit.

29. The electrical connector as in claim 26 wherein said contact housing includes an alignment portion to align said resilient contacts with the contacts on the flexible component and with the contacts on the substrate.

30. The electrical connector as in claim 26 wherein said apertures contain a second contact.

31. The electrical connector as in claim 30 wherein said second contact is a plunger.

32. The electrical connector as in claim 31 wherein said apertures contain a third contact.

33. The electrical connector as in claim 32 wherein said third contact is a plunger.

34. The electrical connector as in claim 26 wherein said resilient contacts in the contact housing are covered with a protective film in order to protect said resilient contacts.

35. An electrical connector for connecting a flexible component to a substrate, the flexible component provided with a plurality of electrical contacts located on a lower surface thereof and the substrate provided with a plurality of electrical contacts located on a upper surface thereof, said connector comprising:

an upper housing having an upper surface and a lower surface;

a contact housing having an upper surface and a lower surface, the contact housing has apertures disposed from the upper surface through to the lower surface, each aperture corresponds to only one contact on the flexible component;

a resilient contact in each aperture for enabling electrical communication between only one electrical contact on the substrate and only one electrical contact on the flexible component, each resilient contact is a wadded wire contact;

an attachment portion to attach the lower surface of the upper housing to the upper surface on the contact housing and to attach the lower surface of the contact housing to the upper surface of the substrate to establish electrical connection between said contacts on the lower surface of said flexible component and said contacts on the upper surface of said substrate through said resilient contacts, said attachment portion comprises at least one leg member, wherein said leg member is provided with threads for receiving a nut.

36. The electrical connector as in claim 35 wherein said flexible component is a flexible cable.

37. The electrical connector as in claim 35 wherein said flexible component is a flexible circuit.

38. The electrical connector as in claim 35 wherein said contact housing includes an alignment portion to align said resilient contacts with the contacts on the flexible component and with the contacts on the substrate.

39. The electrical connector as in claim 35 wherein said apertures contain a second contact.

40. The electrical connector as in claim 39 wherein said second contact is a plunger.

41. The electrical connector as in claim 40 wherein said apertures contain a third contact.

42. The electrical connector as in claim 41 wherein said third contact is a plunger.

43. The electrical connector as in claim 35 wherein said resilient contacts in the contact housing are covered with a protective film in order to protect said resilient contacts.

44. An electrical connector for connecting a flexible component to a substrate, the flexible component provided with a plurality of electrical contacts located on a lower surface thereof and the substrate provided with a plurality of electrical contacts located on a upper surface thereof, said connector comprising:

an upper housing having an upper surface and a lower surface;

a contact housing having an upper surface and lower surface, the contact housing has apertures disposed from the upper surface through to the lower surface, each aperture corresponds to only one contact on the flexible component;

a resilient contact in each aperture for enabling electrical communication between only one electrical contact on the substrate and only one electrical contact on the flexible component, each resilient contact is a wadded wire contact;

a second contact in each aperture, an attachment portion to attach the lower surface of the upper housing and to the upper surface of the contact housing to attach the lower surface of the contact housing to the upper surface of the substrate to establish electrical connection between said contacts on the lower surface of said flexible component and said contacts on the upper surface of said substrate through said resilient contacts.

45. The electrical connector as in claim 44 wherein said second contact is a plunger.

46. The electrical connector as in claim 45 wherein said apertures contain a third contact.

47. The electrical connector as in claim 46 wherein said third contact is a plunger.

48. The electrical connector as in claim 44 wherein said flexible component is a flexible cable.

49. The electrical connector as in claim 44 wherein said flexible component is a flexible circuit.

50. The electrical connector as in claim 44 wherein said resilient contacts in the contact housing are covered with a protective film in order to protect said resilient contacts.

* * * * *